(12) United States Patent
Rupp et al.

(10) Patent No.: US 6,486,505 B1
(45) Date of Patent: Nov. 26, 2002

(54) SEMICONDUCTOR CONTACT AND METHOD OF FORMING THE SAME

(75) Inventors: Thomas S. Rupp, Stormville, NY (US); Jeffrey P. Gambino, Westford, VT (US); Peter Hoh, Hopewell Junction, NY (US); Senthil Srinivasan, Paris (FR)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 09/535,445

(22) Filed: Mar. 24, 2000

(51) Int. Cl.$^7$ ............................................. H01L 27/108
(52) U.S. Cl. ...................... 257/306; 257/309; 257/768
(58) Field of Search ................................. 257/768, 769, 257/770, 412, 306, 309, 522; 438/305, 596, 630, 303, 592, 396, 253, 255, 622

(56) References Cited

U.S. PATENT DOCUMENTS

| | | | | |
|---|---|---|---|---|
| 5,545,578 A | * | 8/1996 | Park et al. | 437/44 |
| 5,889,331 A | * | 3/1999 | Bai | 257/768 |
| 6,010,954 A | * | 1/2000 | Ho et al. | 438/596 |
| 6,060,387 A | * | 5/2000 | Shepela et al. | 438/630 |
| 6,124,177 A | * | 9/2000 | Lin et al. | 438/305 |
| 6,153,485 A | * | 11/2000 | Pey et al. | 438/305 |
| 6,218,241 B1 | * | 4/2001 | Chuang | 438/253 |
| 6,294,436 B1 | * | 9/2001 | Park et al. | 257/306 |
| 6,326,291 B1 | * | 12/2001 | Yu | 438/592 |
| 6,406,986 B1 | * | 6/2002 | Yu | 438/592 |

* cited by examiner

*Primary Examiner*—Olik Chaudhuri
*Assistant Examiner*—Laura M Schillinger
(74) *Attorney, Agent, or Firm*—Slater & Matsil, L.L.P.

(57) ABSTRACT

In one aspect, the present invention discloses a transistor device (see e.g., FIG. 3) that includes first and second source/drain regions 124a and 126 disposed in a semiconductor body 122 and separated by a channel region 128a. A dielectric layer 134a overlies the channel region 128a and a gate electrode 130a/132a overlies the dielectric layer 134a. In the preferred embodiment, the gate electrode includes a polysilicon layer 130a that extends a first lateral distance over the dielectric layer and a silicide layer 132a that extends a second lateral distance over the first polysilicon layer. In this example, the first lateral distance is greater than the second lateral distance.

8 Claims, 7 Drawing Sheets

SEMICONDUCTOR CONTACT AND METHOD OF FORMING THE SAME

FIELD OF THE INVENTION

The present invention relates generally semiconductor devices and more particularly an improved semiconductor contact and method of forming the same.

BACKGROUND OF THE INVENTION

As is known in the art, dynamic random access memories (DRAMs) are used extensively in a wide range of applications. A DRAM typically includes an array of memory cells, each cell comprising a pass transistor, typically a metal oxide semiconductor field effect transistor (MOSFET), coupled in series with a capacitor.

A portion 10 of an array is shown in FIG. 1, which illustrates a complementary pair of bitlines BL and BL'. While this figure only illustrates eight memory cells, it is known to fabricate DRAMs with over one billion cells. The bitline pair BL and BL' is coupled to equalization/precharge circuitry and a sense amplifier, collectively labeled 12. Although not illustrated, many bitline pairs (and respective circuitry 12) will be provided.

Each memory cell includes a pass transistor 14 coupled in series with a capacitor 16. As shown in the figure, one source/drain region of transistor 14 is coupled to the bitline BL (or BL'). The other source/drain region is coupled to one of the plates of respective capacitor 16. The other plate of capacitor 16 is coupled to a common plate reference voltage.

To select a particular memory cell, a select voltage is applied to one of the wordlines WL0–WL7. As illustrated in FIG. 1, the gate of each pass transistor 14 is coupled to one of the wordlines WL0–WL7. Each wordline will also extend across other bitline pairs (not shown) and couple to the gates of pass transistors of those bitlines. The bitline pair BL and BL' is selected by applying a select voltage to the select transistors 18 and 18'. When the select transistors 18 and 18' are selected, the differential voltage signal across the bitline pair will be transferred to input/output lines I/O and I/O'.

FIG. 2 illustrates two DRAM cells 20a and 20b, which might correspond to the pair of cells circled in FIG. 1. Each of the cells 20a and 20b is formed in a silicon body 22 and includes a pass transistor 14 and a capacitor 16. The pass transistor 14 includes a drain region 24 that is separated from a source 26 by a channel region 28. In this case, the two transistors share a common source region 26.

A gate region, including layers 30 and 32, is disposed over channel region 28 and separated therefrom by gate dielectric 34. In this example, the gate region includes a polysilicon layer 30 and a silicide layer 32. The gate region 30/32 will serve as a wordline. A dielectric layer 36, for example a nitride hard mask, overlies the gate 30/32. An insulating layer 38 overlies both memory cells 20a and 20b.

The drain region 24 of each transistor is coupled to a capacitor 16. In this figure, capacitor 16 is drawn schematically. As is known in the art, capacitor 16 may be a trench capacitor, i.e., formed within a trench in semiconductor body 22, or a stack capacitor, i.e., formed from two conductor plates that overlie semiconductor body 22.

Common source region 26 is coupled to bit line 38 through a bit line contact 40. Bit line contact 40, sometimes referred to as a plug, passes vertically through insulating layer 38 between the laterally spaced, adjacent gate electrodes 30/32. It should be noted that the wordlines run beneath and perpendicular to the direction of the bitline 40.

Further, the bitline contact 42 occupies the space between the adjacent wordlines 30/32. Since the contact 42 is separated from gate regions 30/32 by only a thin dielectric 44, a parasitic capacitor is formed between the two conductive regions.

In DRAM development, dimensions such as the device size and storage cell area are getting smaller with each generation of memory systems. As a result, the storage capacitance is becoming smaller and therefore ratio between bitline to wordline capacitance and storage capacitance becomes more significant in the performance of the cell. For example, bitline to wordline capacitance creates noise which makes it difficult to sense the charge in the storage capacitor. Several techniques have been suggested to reduce the capacitance between the bitline and the wordline. Each of these techniques, however, require additional process and fabrication steps thereby increasing the cost of the memory.

SUMMARY OF THE INVENTION

In one aspect, the present invention discloses a transistor device that includes first and second source/drain regions disposed in a semiconductor body and separated by a channel region. A dielectric layer overlies the channel region and a gate electrode overlies the dielectric layer. In the preferred embodiment, the gate electrode includes a polysilicon layer that extends a first lateral distance over the dielectric layer and a silicide layer that extends a second lateral distance over the dielectric layer. In this example, the first lateral distance is greater than the second lateral distance.

This transistor device could be used as a pass transistor of a DRAM cell. For example, two such transistors could share a common source/drain region. A contact would be coupled to the common source/drain region and extend upward between the gate electrodes of the two transistors. Each of these gate electrodes would include two conductors, which could be polysilicon and a silicide. The distance between one of the two conductors and the contact would be greater than the distance between the second conductor and the contact.

Increasing the distance between a conductor and the contact is advantageous since it lowers the capacitance between those two elements. For example, in a DRAM a parasitic capacitance between the wordline and the bitline causes noise in the system and could lead to misinterpretations of the read voltage at the sense amplifier. This embodiment of the invention should help to reduce this problem.

The present invention also provides examples of how such a transistor device could be formed. For example, in one embodiment a composite gate layer is formed over a dielectric layer. The composite gate layer includes a first conductive layer (e.g., polysilicon) and a second conductive layer (e.g., a silicide such as tungsten silicide). A mask layer (e.g., $Si_3N_4$) is formed over the composite gate layer and patterned and etched. The composite gate layer is then patterned and etched using the mask layer as a mask. An undercut etch can then be performed so that a portion of the second conductive layer (e.g., $WSi_x$) beneath the mask layer is removed.

BRIEF DESCRIPTION OF THE DRAWINGS

The above features of the present invention will be more clearly understood from consideration of the following descriptions in connection with accompanying drawings in which.

DETAILED DESCRIPTION

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the cope of the invention.

The present invention relates to an improved semiconductor contact. The referred embodiment will be described in the context of a dynamic random access memory (DRAM). It should be understood, however, that the present invention is applicable in any number of other contexts.

Figure 1:
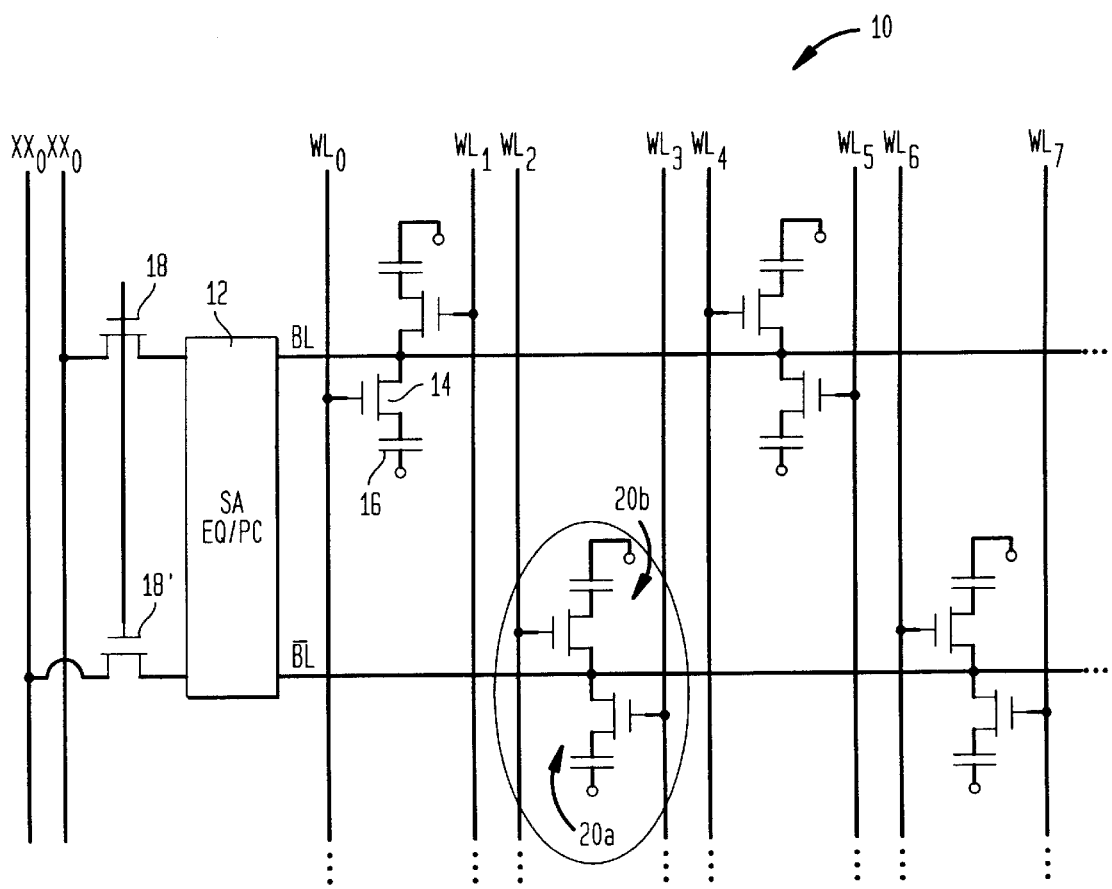
FIG. 1 is a schematic diagram of a portion of a DRAM array.
Figure 2:
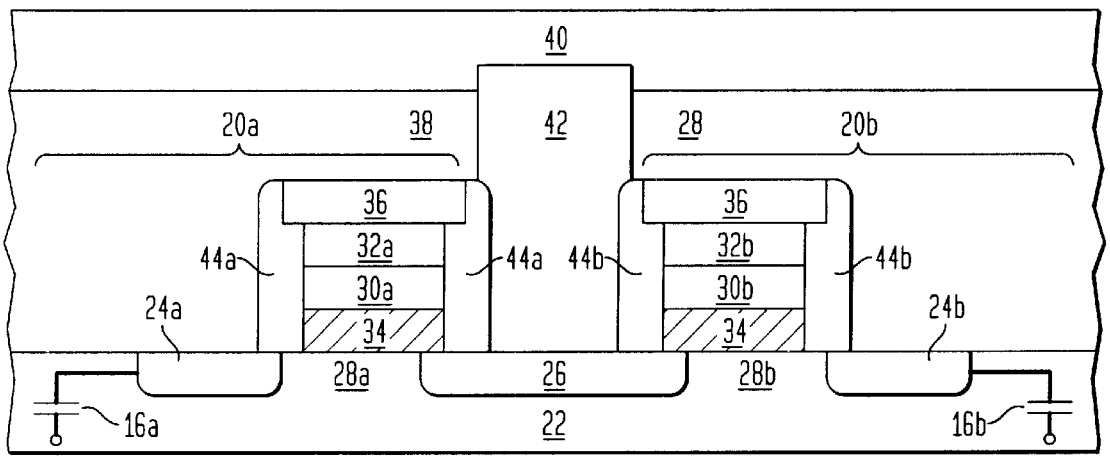
FIG. 2 is a cross-sectional view of two adjacent DRAM cells of the prior art.
Figure 3:
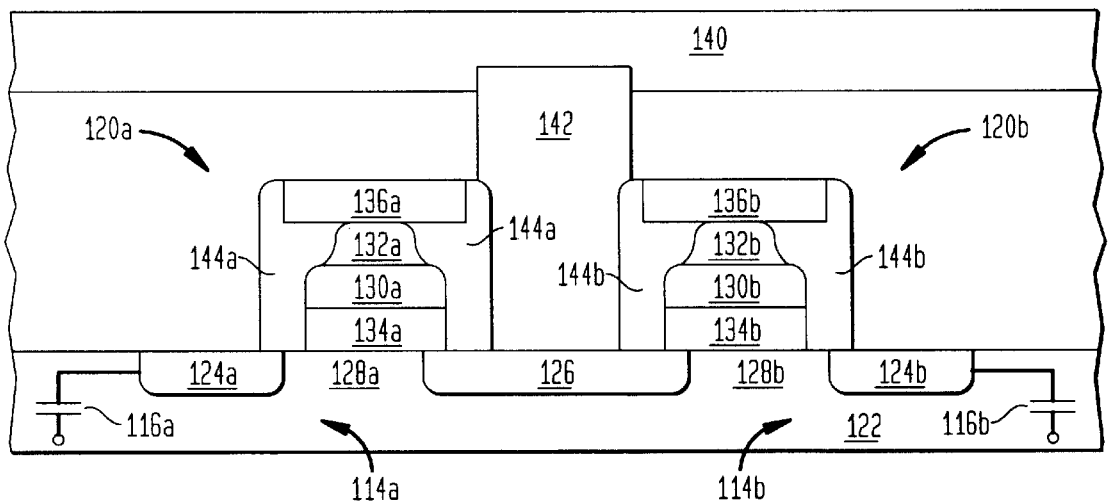
FIG. 3 is a cross-sectional view of two adjacent DRAM cells of the present invention.

Referring now to FIG. 3, a pair of adjacent DRAM cells 120a and 120b is shown with laterally spaced transistors 114a and 114b. The memory cells are typically part of an array as shown in FIG. 1, the description of which will not be repeated here. The memory cells 120a and 120b are formed in semiconductor body 122. Semiconductor body 122 may comprise a semiconductor substrate, a region within another semiconductor body (e.g., a well, a tank or a tub), or a semiconductor layer (e.g., an epitaxial layer grown over semiconductor or an insulator). The preferred semiconductor material is silicon.

For purposes of this discussion, the description of an element without the letter "a" or "b" will refer to either memory cell 120a or 120b. When necessary to distinguish between the two cells, the suffix "a" or "b" will be used.

Each transistor 114 is each coupled to a respective capacitor 116. While capacitor 116 is simply illustrated schematically, it should be understood that the capacitor may be a trench capacitor, a stack capacitor, or even a planar capacitor. In the preferred embodiment, trench capacitors are used.

The transistor 114 has a first source/drain region 126 and a second source/drain region 124. These regions are separated by a channel region 128. In the preferred embodiment, pass transistor 114 is an n-channel transistor. Accordingly, source/drain regions 124 and 126 are preferably doped with arsenic and/or phosphorus. Channel region 128 will typically be doped, with a lighter concentration, of a p-type dopant such as boron.

Overlying channel region 128 is the gate region that includes conductors 130 and 132. In the preferred embodiment, conductor 130 is polysilicon and conductor 132 is a silicide such as tungsten silicide. Other conductive materials could alternatively be used. As discussed above, wordlines are provided by the laterally spaced gate electrodes 130/132.

Gate region 130/132 is separated from channel region 128 by a dielectric layer 134, sometimes referred to as a gate dielectric. Dielectric layer 134 typically comprises an oxide and/or a nitride layer such as silicon dioxide or silicon nitride or silicon oxy-nitride. In the preferred embodiment, an oxide layer is used but other embodiments may use an ON (oxide nitride), an oxide, a nitride, an oxy-nitride layer or an ONO (oxide nitride oxide layer) as examples.

While one of the source/drain regions 124 is coupled to the capacitor 116, the other source/drain region 126 is coupled to a bitline 140 by a bitline contact or plug 142. Bitline contact 142 passes vertically between the laterally spaced gate electrodes 130a/132a and 130b/132b. The bitline 140 is disposed over laterally spaced gate electrodes 130a/132a and 130b/132b. In the example of stack capacitor DRAM, the bitline may pass over the capacitor (e.g., capacitor-under-bitline) or under the capacitor (e.g., capacitor-over-bitline). The present invention would apply to either of these examples.

As illustrated in FIG. 3, the second conductor 132 is formed to be narrower than the first conductor 130. In other words, the second conductive layer 132 has sidewalls that are recessed from the remainder of the gate stack (e.g., dielectric 134, first conductor 130, and/or hard mask 136). In accordance with this feature, the portion of sidewall insulating region 144 between bitline contact 142 and conductive region 132 is thicker than other portions. This greater separation between conductor 132 and conductor 142 has the effect of reducing the parasitic capacitance between the bitline 160 and wordline 130/132.

In the illustrated embodiment, the wordline conductor 132 is also thinner at the end opposite the bitline contact. This feature results from the preferred embodiment process but is not necessary for the present invention. In other words, the present invention envisions an embodiment where the conductor 132 is not symmetric over the conductor 130. It is noted, however, that in a nested structure it almost always will be symmetric.

The etched portion of conductor 132 will cause some increase in resistivity in the wordline. For example, the conductivity might decrease by 30% to 40%. This increase in resistivity is not higher since the conductor 132 is only narrowed in the region adjacent the bit line contact 142. The designer will have to resolve the tradeoff between lowered conductivity and lower capacitance in determining how much of the conductor 132 should be removed.

In an alternate embodiment (not illustrated), the second conductor 132 could be completely eliminated at portions adjacent the bitline contact 142. In this example, adjacent portions of the second conductor 132 would be electrically coupled to one another by first conductor 130. This alternate embodiment is not preferred, however, since the first conductor 130 is typically polysilicon and has a much higher resistivity that the second conductor 132, which is typically a silicide. In most cases, the detriment of increasing the resistivity of the word line outweighs the benefit of lowering the bitline to wordline capacitance.

A preferred embodiment fabrication process that can be utilized to form the device of FIG. 3 is now described with reference to FIGS. 4a–4f.

Figure 4A:
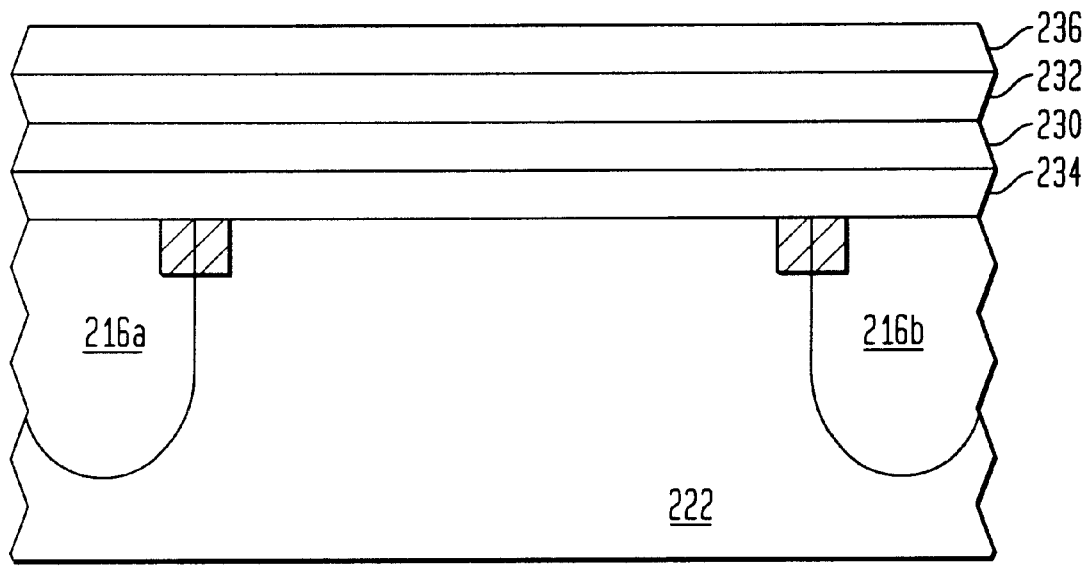
FIGS. 4a–4g are cross-sectional views at various stages of the fabrication of the DRAM cells of the present invention.

Referring first to FIG. 4a, a semiconductor body 222 has two trench capacitors 216a and 216b formed therein. The formation of capacitors 216a and 216b is known in the art and therefore will not be described herein. In the preferred embodiment, semiconductor body 222 comprises a p-type silicon substrate.

Gate dielectric layer 234 is formed over an upper surface of semiconductor body 222. In the preferred embodiment, a silicon dioxide layer ($SiO_2$) 234 is thermally grown on the surface of semiconductor body 222. The silicon dioxide layer 234 is, for example, 30–100 Angstroms thick.

A first conductive layer 230 is formed on an upper surface of the dielectric layer 234. In the preferred embodiment, first conductive layer 230 is formed by depositing a polycrystalline silicon (polysilicon) layer, for example using chemical vapor deposition techniques. Polysilicon layer 230 is preferably doped, either in situ or after deposition. First conductive layer 106 can be, for example, approximately 100–1000 Angstroms thick.

A second conductive layer 232 is formed over the first conductive layer 230. For example, a metal layer 230 may be formed over conductive layer 230. In typical embodiments, the second conductive layer 232 has a lower resistivity that first conductive layer 230. In the preferred embodiment, second conductive layer 232 comprises a silicide layer such as tungsten silicide ($WSi_x$). Other silicides such as titanium silicide or cobalt silicide could alternatively be used. In the preferred embodiment, second conductive layer 232 is deposited by chemical vapor deposition of tungsten silicide and has a thickness of about 100 to about 1000 Angstroms. The conductive layers 230 and 232 form a composite conductor.

On top of the second conductive layer 232, a dielectric layer 236, such as a silicon nitride ($Si_3N_4$) layer 110 is deposited with low pressure chemical vapor deposition (LPCVD) and has a thickness of about 2000 Angstroms. Dielectric layer 236 will serve as a hard mask in later process steps, see e.g., FIG. 4c.

Figure 4B:
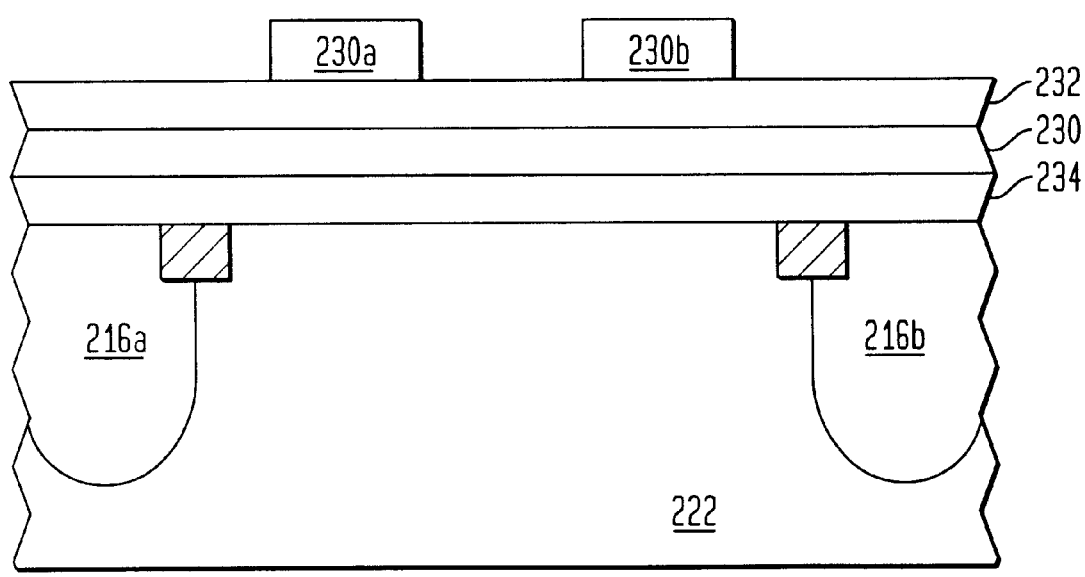

As shown in FIG. 4b, hard mask layer 236 is patterned and etched in the shape of the wordlines (two of which are shown in the figures). This step may be performed using standard photolithographic techniques. The etching process could use a reactive ion etch (RIE) under conditions known in the art.

Figure 4C:
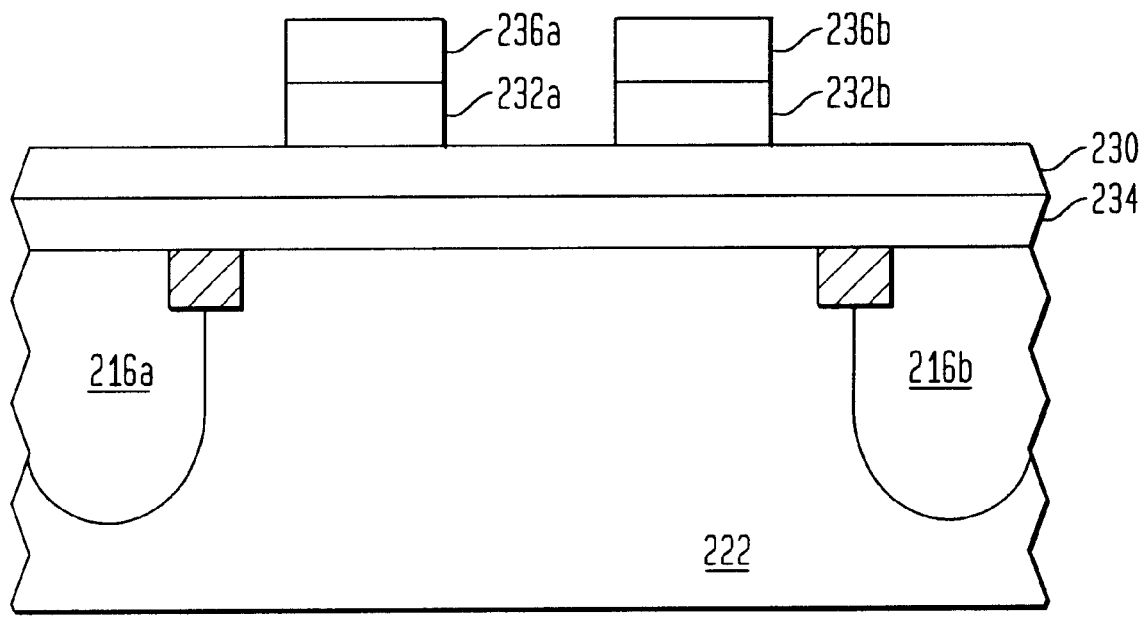

Referring next to FIG. 4c, with the dielectric 236 acting as a mask, an etch is performed in a substantially perpendicular direction to the substrate 222 to remove portions of second conductive layer 232. As an example, the etch may be a reactive ion etch (RIE) using a chlorine etch chemistry. While the preferred process uses an RIE, other anisotropic etches could alternatively be used. In the preferred embodiment, the etching stops before removing substantial portions of dielectric 234.

Figure 4D:
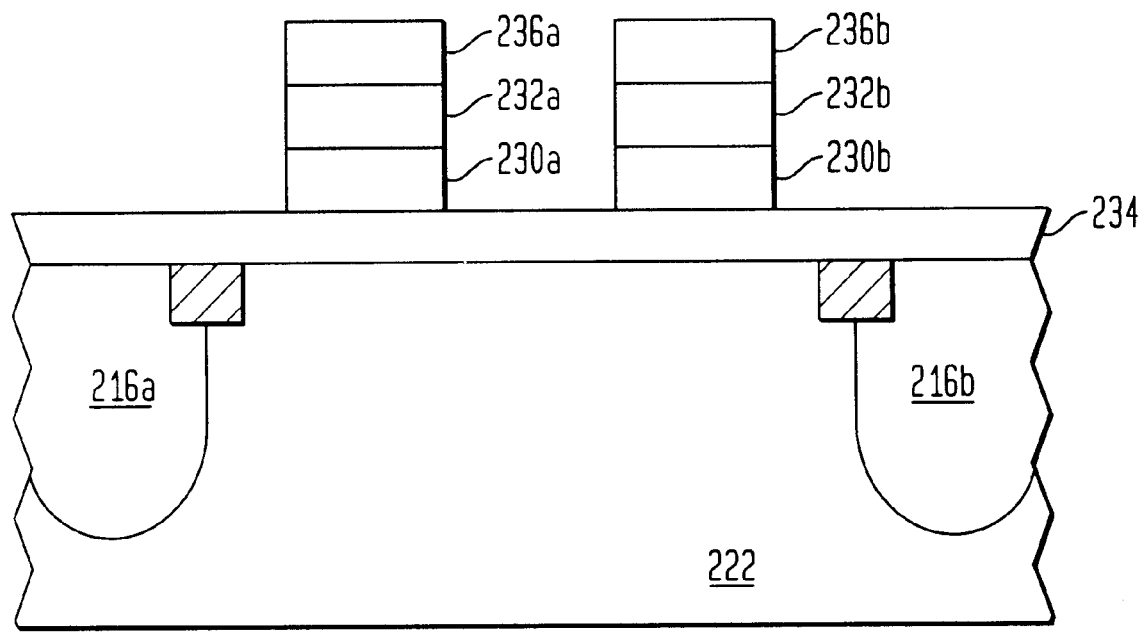
Figure 4E:
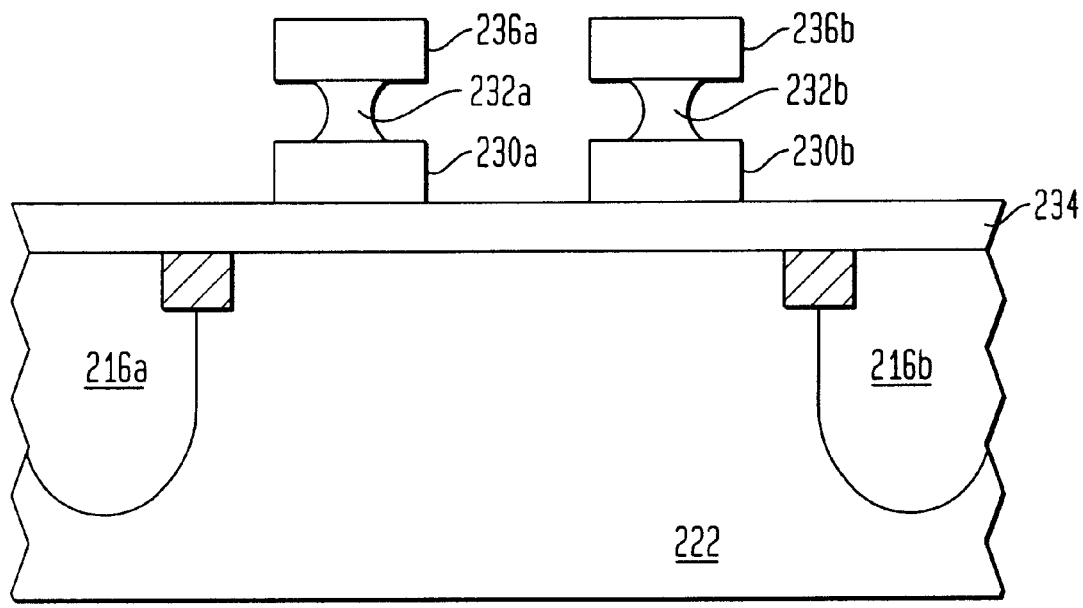

FIGS. 4d and 4e illustrate how an undercutting process is used to form a reduced cross-sectional area for individual wordlines 230a/232a and 230b/232b. Other embodiments for achieving the undercut will be described in FIGS. 5a–5b and 6a–6c below. In the embodiment of FIGS. 4d and 4e, the RIE chemistry is selected to etch polysilicon 230 selective to oxide layer 234 and nitride layer 236. When layer 230 is etched, the wordline structure is as shown in FIG. 4d.

When the etching is continued, the reactive species in the RIE chemistry, which would have normally reacted with and been consumed by polysilicon layer 230 are now "free." Since the process conditions have been selected so that removal of oxide layer 234 is minimized, the "free" reactive ions, radicals, and/or neutrals start etching polysilicon layer 230 and silicide 232 laterally. Due to the nature of the process, silicide layer 232 etches laterally at a faster rate than polysilicon layer 230 or nitride layer 236, resulting in the structure shown in FIG. 4e. The extent of the lateral etch is proportional to the duration of the etch process after layer 230 has been removed and the spacing between adjacent wordlines.

It is noted that substantial lateral removal of polysilicon layer 230 is not desirable since the length of polysilicon layer 230 will determine the length of the pass transistor of the memory cell. This length is typically determined by electrical characteristics of the circuit.

The difference in width of hard mask 236 and of conductive layer 232 is about twice the amount of undercutting on a single side of layer 232. The silicide layer 232 is, therefore, located between wider layers 230 and 236 to form a mesa-type structure for the wordline. This undercut decreases the capacitance between the wordline 230/232 and the bitline 240 (see FIG. 3).

A preferred RIE process for use in the undercutting step has a chlorine-oxygen gas chemistry. Operating pressures are from about 4 to about 15 millitorr at a chamber temperature of about 50 to about 60° C. Chlorine gas is delivered at a rate of about 10 to about 30 sccm and oxygen is delivered at a rate of about 10 sccm. The etching time is dependent on the distance between conductors 230a/232a and 230b/232b. For example, an etching time of about 40 seconds is used for a distance between wordlines of less than about 5000 Angstroms to remove a distance of about 100 to 1000 Angstroms from each side of the second conductive layer 232 with a chlorine-oxygen RIE etch.

Figure 5A:
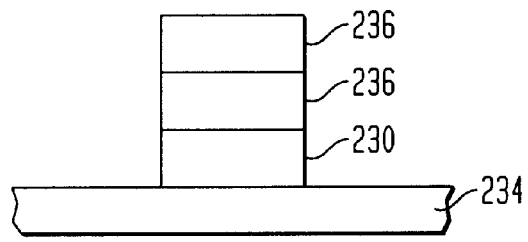
FIGS. 5a–5b are cross-sectional views of an alternate embodiment undercut etch process.
Figure 5B:
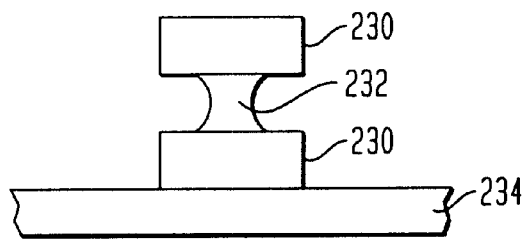

As alluded to above, the undercutting affect can be achieved in other ways. FIGS. 5a and 5b illustrate one such alternate embodiment. As shown in FIG. 5a, an anisotropic etch is performed to etch both silicide layer 232 and polysilicon layer 230. After this etch is complete, an undercut etch is performed on the silicide layer 232. This undercut etch will form the structure shown in FIG. 5b (which is similar to that of FIG. 4e).

Figure 6A:
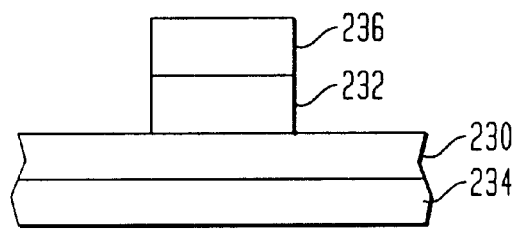
FIGS. 6a–6c are cross-sectional views of a second alternate embodiment undercut etch process.
Figure 6B:
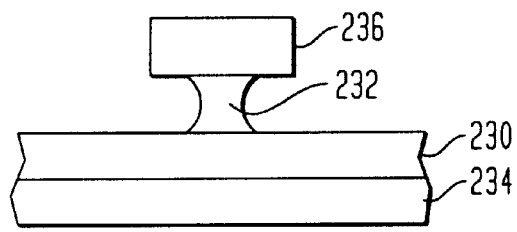
Figure 6C:
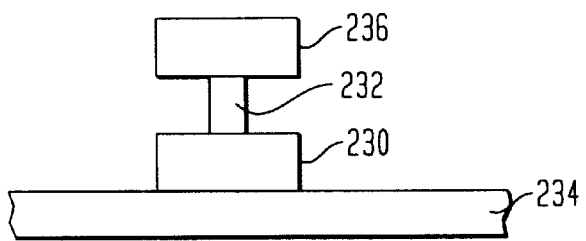

FIGS. 6a–6c illustrate a second alternate embodiment. As shown in FIG. 6a, silicide layer 232 is anisotropically etched. This layer 232 can then be isotropically etched with an etchant selective to the silicide as shown in FIG. 6b. After the undercut is complete, the polysilicon layer 230 can be etched. The resulting structure is shown in FIG. 6c, which is similar to that of FIG. 4e.

The resulting structure of each of the embodiments is shown in FIG. 4e. A pair of wordline stacks are formed by the etching process with a space of less than 5000 Angstroms located between the stacks. Each of the stacks are less than about 5000 Angstroms long and include layers 230 and 232. The silicon dioxide layer 344 serves as an etch stop. Although only two stacks 230/232 are shown in the figures, it should be understood that a multitude of stacks with spaces located between adjacent stacks can be fabricated using the above described method.

Figure 4F:
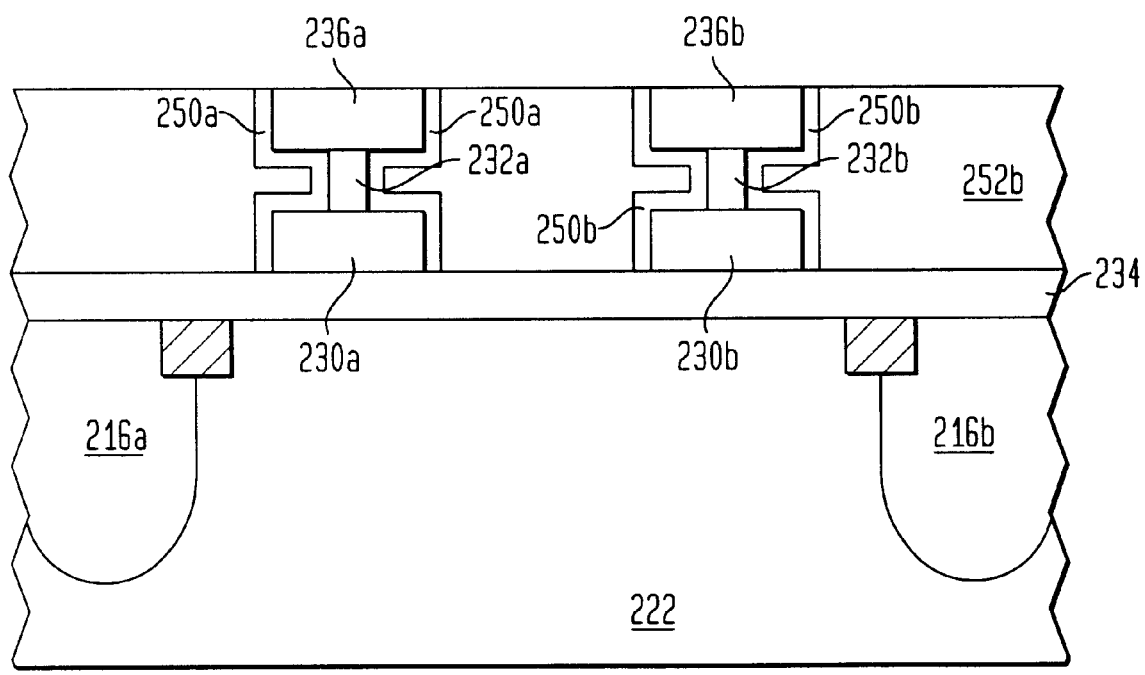

Referring to FIG. 4f, after the gate stack formation, a sidewall oxide 250 is thermally grown (e.g., to a thickness of about 30 to about 200 A) on the polysilicon 230 as well as on the silicide 232 surfaces exposed. This sidewall oxide 250 serves as a passivation as well as a part of the dielectric to provide the isolation for the contact.

Sidewall spacer material 252 is then deposited to fill the undercut area completely. In the preferred embodiment, sidewall spacer 252 is formed by depositing conformal silicon nitride. The requirement for this deposition thickness is half the thickness of the silicide layer 232. In the illustrated example, the undercut region is completely filled along with the region between wordline stacks 230a/232a and 230b/232b.

Figure 4G:
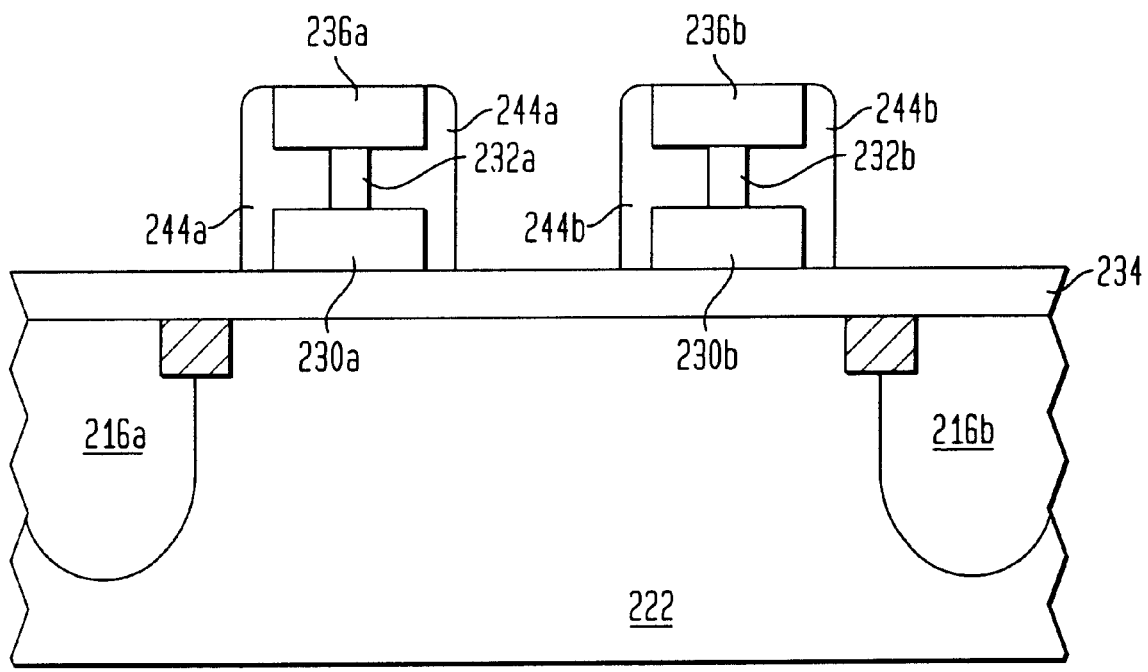

Referring next to FIG. 4g, an anisotropic etch is performed in order to form a spacer 244. In the preferred embodiment, the resulting spacer structure 244 is completely vertical on the outside of the stack so that bitline contact 142 (see FIG. 3) can be deposited.

Although not shown, BPSG (and optional oxide) can then be deposited and reflowed as known in the art. The contact hole formation is done as a self-aligned contact as is also known in the art. The following plug can be formed by silicon deposition and recess. After the bitlines are etched, they can be filled and structurized by a dual damascene process know in the art.

Thus, as described above, the capacitance between the wordline 230/232 and the bitline 240 is reduced because the distance between wordline conductors 232 and bitline contact 242 is increased. In the preferred embodiment, this is accomplished during the formation of the wordlines by performing an undercut in the conductive silicide layer 232. By undercutting the silicide layer 232, a thicker dielectric can be provided between the wordline 232 and the bitline contact 240.

In the embodiment of FIG. 4, the etching gases of the process are trapped in between the adjacent wordline and therefore etch the side surfaces of the silicide conductive layer 232. With this process, the conductive polysilicon layer 230 may also be laterally etched.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A dynamic random access memory device including a transistor device, the memory device comprising:
    a first source/drain region disposed in a semiconductor body;
    a second source/drain region disposed in the semiconductor body, the second source/drain region being spaced from the first source/drain region by a channel region;
    a plug contact extending out from the first source/drain region;
    a dielectric layer overlying the channel region;
    a gate electrode overlying the dielectric layer, the gate electrode including:
        a polysilicon layer spaced a first distance from the plug contact; and
        a conductive layer disposed over the polysilicon layer and spaced a second distance from the plug contact, the second distance being greater than the first distance, the conductive layer having a lower resistivity than the polysilicon layer;
    an insulating region disposed between the gate electrode and the plug contact; and
    a capacitor with a first plate coupled to the second source drain region.

2. The device of claim 1 wherein the ratio of the first lateral distance to the second lateral distance is about two-to-one.

3. The device of claim 1 and wherein the insulating region comprises a sidewall insulating region disposed along a sidewall of the gate electrode, the sidewall insulating region being thicker at a portion laterally adjacent the conductive layer as compared to a portion laterally adjacent the polysilicon layer.

4. The device of claim 3 wherein:
    the polysilicon layer extends a first lateral distance over the dielectric layer and the conductive layer extends a second lateral distance over the dielectric layer, the second lateral distance being less that the first lateral distance; and
    the portion of the sidewall insulating layer adjacent the conductive layer is thicker than the portion adjacent the polysilicon layer by about half of the difference between the first lateral distance and the second lateral distance.

5. The device of claim 1 wherein the polysilicon layer extends a first lateral distance over the dielectric layer and the conductive layer extends a second lateral distance over the dielectric layer, the second lateral distance being less that the first lateral distance.

6. The device of claim 1 wherein the conductive layer comprises a silicide layer.

7. The device of claim 6 wherein the silicide layer comprises a tungsten silicide layer.

8. The device of claim 1 wherein the insulating region has a thickness between about 15 nm and 45 nm between the conductive layer and the plug contact.

* * * * *

UNITED STATES PATENT AND TRADEMARK OFFICE
CERTIFICATE OF CORRECTION

PATENT NO. : 6,486,505 B1 Page 1 of 1
DATED : November 26, 2002
INVENTOR(S) : Rupp et al.

It is certified that error appears in the above-identified patent and that said Letters Patent is hereby corrected as shown below:

Title page,
Item [73], Assignee, add
-- International Business Machines Corporation, Armonk, NY --

Signed and Sealed this

Sixth Day of April, 2004

JON W. DUDAS
*Acting Director of the United States Patent and Trademark Office*